(12) United States Patent
Shin et al.

(10) Patent No.: US 6,528,993 B1
(45) Date of Patent: Mar. 4, 2003

(54) MAGNETO-OPTICAL MICROSCOPE MAGNETOMETER

(75) Inventors: Sung Chul Shin, Taejon-si (KR); Sug Bong Choe, Taejon-si (KR)

(73) Assignee: Korea Advanced Institute of Science & Technology, Taejon-Si (KR)

( * ) Notice: Subject to any disclaimer, the term of this patent is extended or adjusted under 35 U.S.C. 154(b) by 0 days.

(21) Appl. No.: 09/717,611

(22) Filed: Nov. 21, 2000

(30) Foreign Application Priority Data

Nov. 29, 1999 (KR) ............................................. 99-53373
Sep. 22, 2000 (KR) ........................................ 2000-55900

(51) Int. Cl.[7] ...................... G01R 33/032; G01R 33/12; G02B 27/28
(52) U.S. Cl. ........................ 324/223; 324/226; 324/235; 324/244.1; 359/484
(58) Field of Search .................................. 324/222, 223, 324/226, 235, 244.1, 260, 261; 359/280, 368, 484

(56) References Cited

U.S. PATENT DOCUMENTS 5,583,690 A * 12/1996 Andrae et al. ............... 359/368
5,792,569 A * 8/1998 Sun et al.
5,954,991 A * 9/1999 Hong et al.
6,178,112 B1 * 1/2001 Bessho et al.
6,180,415 B1 * 1/2001 Schultz et al.

FOREIGN PATENT DOCUMENTS

JP          2-83474      *   3/1990

OTHER PUBLICATIONS

Quantitative Analysis On Correlation Between Local Coercivity And Reversal Time In Ferromagnetic Thin Films, By Choe et al., Journal of Applied Physics, Sep. 1, 2000, vol. 88, No. 5, pp. 3096–3098.
Magnetization–Reversal Processes In An Ultrathin Co/Au Film, By J. Ferre et al., Physical Review B, Jun. 1, 1997, vol. 55, No. 22, pp. 15 092–15–012.
Magnetization Reversal In Arrays Of Perpendicularly Magnetized Ultrathin Dots Coupled By Dipolar Interaction, by T. Aign et al., Physical Review Letters, Dec. 21, 1998, vol. 81, No. 25, pp. 5656–5659.

* cited by examiner

*Primary Examiner*—Gerard R. Strecker
(74) *Attorney, Agent, or Firm*—Greenblum & Bernstein, P.L.C.

(57) ABSTRACT

A magneto-optical microscope magnetometer capable of simultaneously measuring a hysteresis loop and activation magnetic moment of a submicrometer-scale local area (about 0.3×0.3 $\mu$m). An electromagnet capable of applying a magnetic field to a magnetic material is attached to a polarizing optical microscope capable of observing a magnetized state of the magnetic material, such that images of the microscope varying with the strength of the applied magnetic field are grabbed in real time by a charge coupled device camera and then analyzed. The magneto-optical microscope magnetometer can measure a hysteresis loop and activation magnetic moment in a submicrometer-scale local area observed by the polarizing optical microscope. Further, the magneto-optical microscope magnetometer can measure hysteresis loops and activation magnetic moments simultaneously with respect to all CCD pixels of the camera and observe coercivity and activation magnetic moment distributions of the entire magnetic material.

6 Claims, 5 Drawing Sheets

MAGNETO-OPTICAL MICROSCOPE MAGNETOMETER

BACKGROUND OF THE INVENTION

1. Field of the Invention

The present invention relates in general with both magnetometers and magnetic microscopes and in particular with a magneto-optical microscope magnetometer (MOMM) capable of a simultaneous measurement of local hysteresis loops and local activation magnetic moments of submicrometer-scale local areas (about 0.3×0.3 μm).

2. Description of the Prior Art

Generally, magnetic materials continue to be widely used in traditional industry as permanent magnets, transformers, motors, etc. Recently, such magnetic materials have been more extensively studied for use as advanced materials for information storage medias, magnetic sensors, etc. In the magnetic information technology, information is stored in the form of magnetic domains and the magnetization reversal process of the domains under applied magnetic fields is basically involved. It is generally considered that the detailed domain structure and domain reversal dynamics depend on local microscopic magnetic properties. The local magnetic properties are, in general, spatially inhomogeneous due to structural and/or chemical imperfections. Therefore, to achieve high-performance of the magnetic information technology, it is important to characterize and monitor the local magnetic properties with a high spatial resolution.

Thus, much effort has been devoted to developing magnetic microscopes capable of measuring magnetic properties of a local area. As such magnetic microscopes, there have been utilized (i) a magneto-optical microscope adopted from optical microscopy, (ii) a magnetic force microscope and near-field scanning optical microscope adopted from scanning microscopy and (iii) a scanning electron microscope, Lorentz transmission electron microscope and low-energy electron microscope adopted from electron microscopy. However, the above-mentioned magnetic microscopes, except for the magneto-optical microscope, cannot measure the dynamic characteristics of magnetic materials under applying a magnetic field, for instance, a hysteresis loop nor an activation magnetic moment, due to limitations imposed on the impossibility of applying a magnetic field and/or slow data acquisition time.

On the other hand, there [have] has been developed several measurement techniques for probing the dynamic characteristics, for instance, the hysteresis loop and the activation magnetic moment, of magnetic materials. First, the hysteresis loop is a curve indicating a magnetized state of a magnetic material depending on the strength of an external magnetic field. This curve continues to be one of the most representative data used for the measurement of magnetic properties of a magnetic material, from which curve can be obtained magnetic information, for instance, a coercivity, magnetization reversal mechanism, magnetic domain formation, etc. Second, the activation magnetic moment signifies a basic magnetic moment of a magnetic material acting as a single particle when the magnetization of the magnetic material reverses by applying a magnetic field that is externally applied to the magnetic material. The activation magnetic moment is the most basic physical quantity describing a dynamic characteristic of a magnetic material, where the activation magnetic moment can be obtained from the dependence on an external magnetic field and magnetization reversal dynamics of the magnetic material.

Up to the present, the vibrating sample magnetometer (or magneto-optical magnetometer) has generally been used to measure the hysteresis loop and activation magnetic moment. However, even though such conventional magnetometers can microscopically measure the hysteresis loop and activation magnetic moment over the entire area of a magnetic material, they cannot measure them for a submicrometer-scale local area of the magnetic material.

To sum up, conventional magnetometers can microscopically measure a hysteresis loop and activation magnetic moment over the entire area of a magnetic material but cannot measure them for a submicrometer-scale local area of the magnetic material, whereas conventional magnetic microscopes can observe magnetic properties of the submicrometer-scale local area of the magnetic material, but cannot measure the hysteresis loop and activation magnetic moment.

SUMMARY OF THE INVENTION

Therefore, the present invention has been motivated to overcome the above problems, and it is an object of the present invention to provide a magneto-optical microscope magnetometer which is capable of measuring a hysteresis loop and activation magnetic moment of a submicrometer-scale local area by performing both functions of a conventional magneto-optical microscope and conventional magneto-optical magnetometer.

In accordance with the present invention, the above objects can be accomplished by a magneto-optical microscope magnetometer that comprises an electromagnet unit for applying a magnetic field to a magnetic material; a polarizing optical microscope for magnifying and visualizing a magnetized state of the magnetic material via the magneto-optical effect; a camera system for detecting the image visualized by the polarizing optical microscope; a data analysis system for obtaining a hysteresis loop or an activation magnetic moment from the time-resolved images grabbed by the camera system; and a magnetic field control system to remotely control the electromagnet for applying the magnetic field into the magnetic material.

Preferably, the polarizing optical microscope may include a light source; a polarizer for linearly polarizing a light beam from the light source; a beam splitter for reflecting the light beam from the polarizer to an objective lens; an objective lens for focusing the light beam from the beam splitter onto the magnetic material and then, collimating the light beam reflected from the magnetic material to an analyzer; an analyzer for converting the polarized light beam from the objective lens into the image intensity by linearly polarizing it; and a camera lens for focusing the image from the analyzer to the camera system.

Further, the camera system may include an image intensifier for amplifying the image intensity from the polarizing optical microscope; a charge coupled device (CCD) camera for detecting the image amplified by the image intensifier; and an image grabber for grabbing the image detected by the camera into a digital signal.

Further, the electromagnet unit may include an electromagnet for generating the magnetic field; and a power supply for the electromagnet.

More preferably, the data analysis system may obtain the polar Kerr hysteresis loop from the images grabbed by the camera system. The data analysis algorithm is developed based on equation 1, below, which describes the relation between a Kerr angle and a Kerr intensity, where the Kerr angle is a rotational angle of the polarized light during reflection at the magnetic material via the magnetooptical Kerr effect, while the Kerr intensity is the light intensity detected by the camera system due to the magnetooptical Kerr effect. The polar Kerr hysteresis loop can be obtained from the Kerr intensity variation with respect to the strength of the applied external magnetic field, using equation 2, below, which is converted from the equation 1.

$$I(H) = I^0 + C \sin^2(\theta(H) + \alpha H + \Delta\theta)$$ [Equation 1]

$$\left[\frac{\theta(H)}{\theta_M}\right] = \left[\frac{\Delta\theta}{\theta_M}\right] + \left[\frac{\alpha}{\theta_M}\right]\left[\sqrt{\frac{I(H) - I^0}{C_a^2}} - H\right]$$ [Equation 2]

where I is the Kerr intensity measured at a unit CCD pixel of the camera system, $I^0$ is an intensity offset for the given CCD pixel, C is a proportional constant of the Kerr rotation angle, α is a Faraday constant at the objective lens, Δθ is an angle between the polarizer and analyzer, $\theta_M$ is a maximum Kerr rotation angle when the magnetic material is saturated, and H is a strength of the magnetic field applied to the magnetic material.

In addition, the data analysis system may obtain the activation magnetic moment from the time-resolved image detected by the camera system; the switching time of the magnetic material under an applied magnetic field is measured from the temporal variation of the Kerr intensity measured by the camera system and then, the activation magnetic moment is determined from the field dependence of the switching time using equation 3:

$$\tau = \tau_0 \exp((E_B - m_A H)/k_B T)$$ [Equation 3]

where τ is a magnetization switching time depending on the magnetic filed H applied to the magnetic material, $\tau_0$ is a characteristic switching time, $m_A$ is the activation magnetic moment, $k_B$ is a Boltzmann constant and T is a temperature.

In a feature of the present invention, there is provided a magneto-optical microscope magnetometer capable of performing the functions of a conventional magneto-optical microscope and a conventional magneto-optical magnetometer by using an individual CCD pixel in the conventional magneto-optical micrometer as a photo detector in the conventional magneto-optical magnetometer. Thus, the magneto-optical microscope magnetometer can measure a hysteresis loop as well as an activation magnetic moment in a submicrometer-scale local. Further, the magneto-optical microscope magnetometer can simultaneously measure hysteresis loops and activation magnetic moments for all the CCD pixels and thus, it can generate the 2-dimensional distribution of the coercivity and activation magnetic moment for the entire magnetic material.

BRIEF DESCRIPTION OF THE DRAWINGS

The features and advantages of the present invention will be more clearly understood from the following detailed description taken in conjunction with the accompanying drawings, in which.

DETAILED DESCRIPTION OF THE PREFERRED EMBODIMENTS

Figure 1:
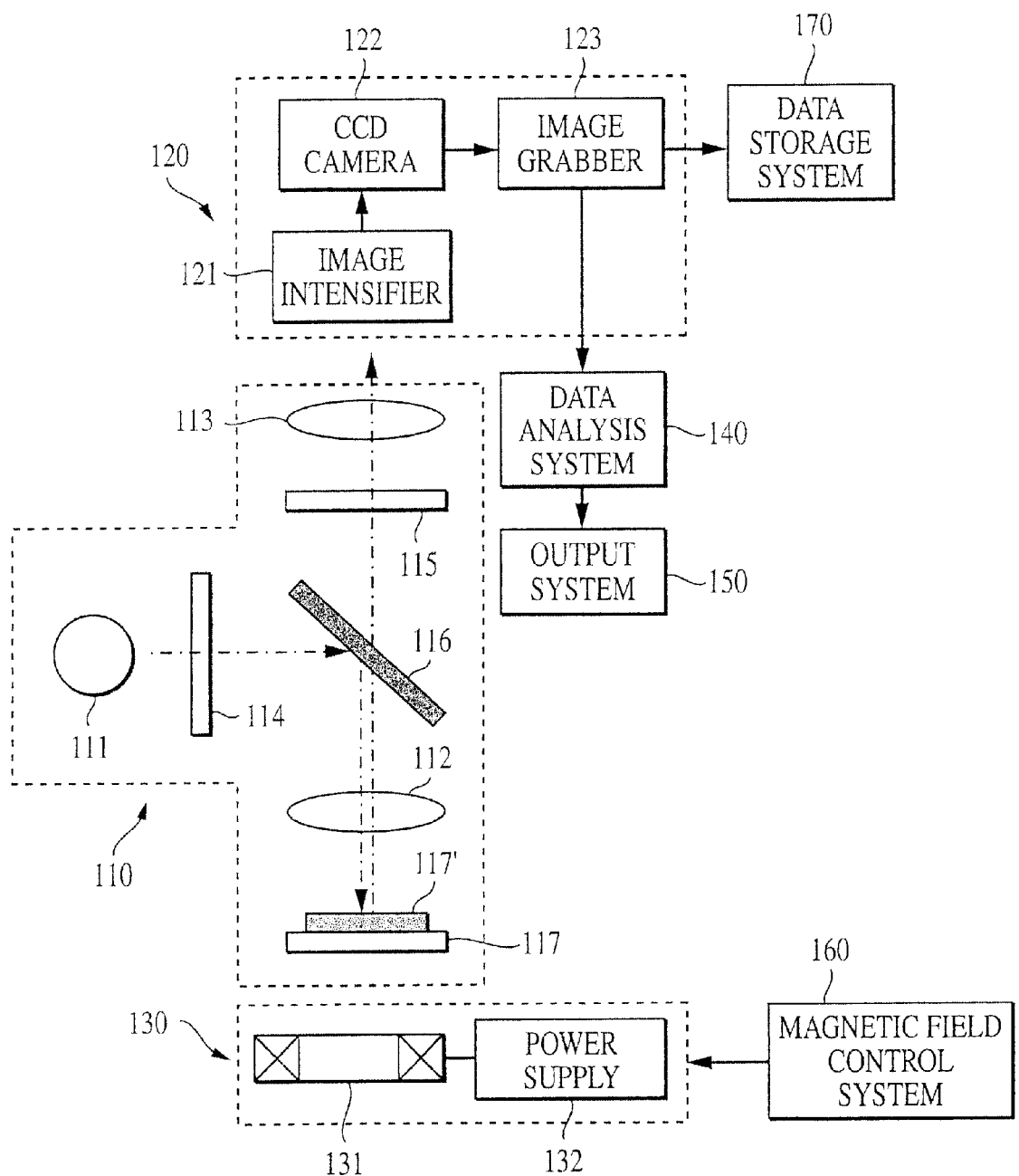
FIG. 1 is a schematic diagram of a magneto-optical microscope magnetometer in accordance with the present invention.

FIG. 1 is the schematic diagram of a magneto-optical microscope magnetometer in accordance with the present invention.

With reference to FIG. 1, the magneto-optical microscope magnetometer comprises an electromagnet unit 130 for applying a magnetic field to a magnetic material 117', a polarizing optical microscope 110 for magnifying and visualizing a magnetized state of the magnetic material 117', and a charge coupled device (CCD) camera system 120 for detecting the image visualized by the polarizing optical microscope 110 in real time. A data analysis system 140 is provided to obtain hysteresis loops and activation magnetic moments from the image grabbed by the CCD camera system 120. An output system 150 is adapted to output the results of the hysteresis loop and activation magnetic moment measured by the data analysis system 140. A data storage system 170 functions to store the images grabbed by the CCD camera system 120, and a magnetic field control system 160 functions to remotely control the electromagnet unit 130 for applying the magnetic field into the magnetic material 117'.

The polarizing optical microscope 110 includes a light source 111, such as, for example, a 100 Watt mercury lamp, a polarizer 114 and an analyzer 115 of sheet-type polarizers with an extinction ratio of 0.01%, a beam splitter 116, an objective lens 112 having a numerical aperture of 0.95 and a spatial resolution of 0.3 μm, a sample stage 117 for supporting the magnetic material 117' thereon, and a camera lens 113.

The light source 111 emits a light beam, which is then linearly polarized by the polarizer. The light beam is reflected by the beam splitter 116 and then, focused on the magnetic material 117' via the objective lens 112. The light beam reflected from the magnetic material 117' is collimated by the objective lens 112 and then transmitted to the analyzer 115 via beam splitter 116. The analyzer 115 converts the polarization state of the transmitted light beam into an intensity variation image, which is focused to the CCD camera system 120 via the camera lens 113.

The polarization state of the light reflected from the magnetic material 117' is converted into the intensity variation image by the analyzer 115 according to a magneto-optical effect, as will hereinafter be described in detail.

The magneto-optical Kerr effect is a phenomenon in which a linear polarization angle is rotated by the Kerr rotational angle during a reflection at a magnetic material. Therefore, the light beam, linearly polarized by the polarizer 114 and incident on the magnetic material 117', is rotated in its linear polarization axis according to a magnetized state of the magnetic material 117'. Then, the polarization state is converted into an intensity variation, after transmitting through the analyzer 115. As a result, a magnetized state of the magnetic material 117' can be observed by an intensity variation in an image visualized by the polarizing optical microscope 110.

The CCD camera system 120 includes an image intensifier 121 having an amplification feature of approximately ten thousand a CCD camera 122 having 640×480 CCD pixels, and an image grabber 123 for grabbing image data with 256 digitized values in real time.

The image from the polarizing optical microscope 110 is amplified in its light intensity by the image intensifier 121 and then grabbed by the CCD camera 122 in real time. The image grabbed by the CCD camera 122 is converted into a digital signal by the image grabber 123 and then stored in the data storage system 170.

The CCD camera 122 measures the light intensity by every CCD pixel arranged at regular intervals and then, it generates visual images by mapping the light intensities on the corresponding positions of a 2-dimensional XY plane.

The electromagnet unit 130 includes an electromagnet 131 for generating the magnetic field, and a power supply 132 for the electromagnet 131, where the power supply 132 is remotely controlled by the magnetic field control system 160.

The electromagnet 131 is equipped with a water-cooling system and is positioned under the sample support 117. Preferably, the electromagnet 131 may apply a magnetic field of ±5 KOe to the magnetic material 117'.

The data analysis system 140 is adapted to obtain a Kerr hysteresis loop from the images grabbed by the camera system 120. The data analysis algorithm is developed based on equation 1, which describes the relationship between the Kerr angle $\theta$ and the Kerr intensity I, where the Kerr angle is a rotational angle of the polarized light during a reflection at the magnetic material via the magnetooptical Kerr effect, while the Kerr intensity is the light intensity detected by the camera system due to the magnetooptical Kerr effect. The polar Kerr hysteresis loop can be obtained from the Kerr intensity variation with respect to the strength of the applied external magnetic field, using equation 2, which is converted from equation 1 under an assumption rate $\theta$ that is so small that sin $\theta \cong \theta$.

$$I(H) = I^0 + C \sin^2(\theta(H) + \alpha H + \Delta\theta) \quad \text{[Equation 1]}$$

$$\left[\frac{\theta(H)}{\theta_M}\right] = \left[\frac{\Delta\theta}{\theta_M}\right] + \left[\frac{\alpha}{\theta_M}\right]\left[\sqrt{\frac{I(H)-I^0}{C_a^2}} - H\right] \quad \text{[Equation 2]}$$

where I is the Kerr intensity measured at a unit CCD pixel of the camera system, $I^0$ is an intensity offset for the given CCD pixel, C is a proportional constant of the Kerr rotation angle, $\alpha$ is a Faraday constant of the objective lens, $\Delta\theta$ is an angle between the polarizer and analyzer, $\theta_M$ is the maximum Kerr rotation angle when the magnetic material is saturated, and H is the strength of the magnetic field applied to the magnetic material.

The data analysis system 140 is further adapted to obtain the activation magnetic moment from the time-resolved image detected by the camera system 120; the switching time of the magnetic material under an applied magnetic field is measured from the temporal variation of the Kerr intensity measured by the camera system and then, the activation magnetic moment is determined from the field dependence of the switching time using the equation 3:

$$\tau = \tau_0 \exp((E_B - m_A H)/k_B T) \quad \text{[Equation 3]}$$

where $\tau$ is the magnetization switching time depending on the magnetic field H applied to the magnetic material, $\tau_0$ is a characteristic switching time, $m_A$ is the activation magnetic moment, $k_B$ is a Boltzmann constant and T is a temperature.

Now, a detailed description for obtaining the hysteresis loop and the activation magnetic moment will be given based on typical results measured by the magneto-optical microscope magnetometer with the above-mentioned construction in accordance with the present invention, as follows.

Figure 2:
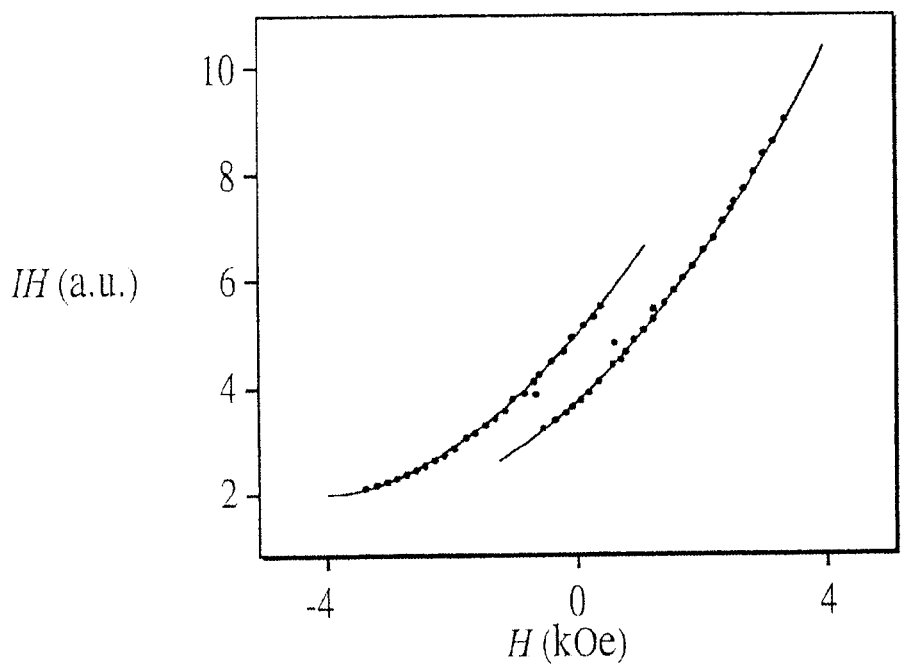
FIG. 2 is a plot showing a Kerr intensity variation I measured by a single CCD pixel with respect to a magnetic field H applied to a magnetic material in FIG. 1.
Figure 3:
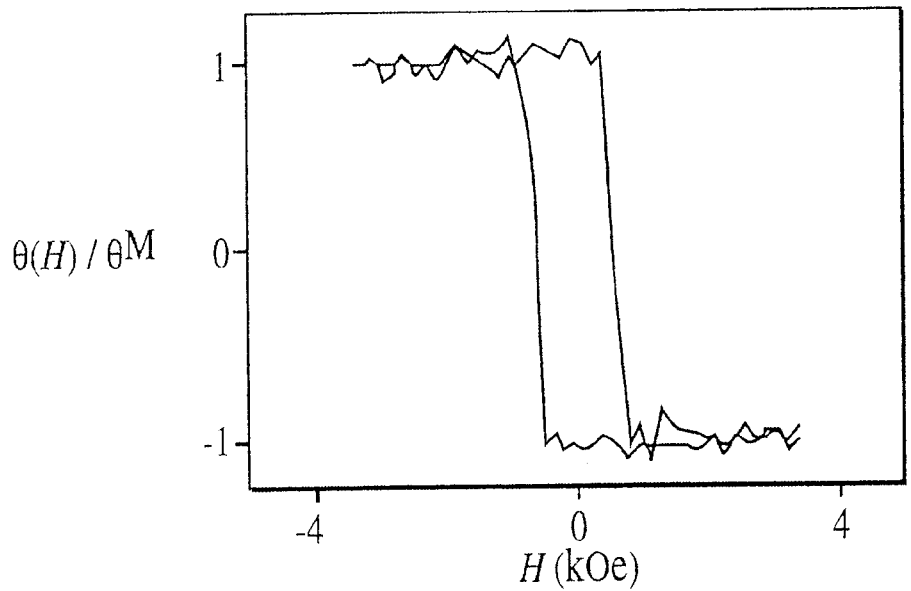
FIG. 3 is a hysteresis loop of a 0.3×0.3 μm² area obtained by converting the data in FIG. 2 using specific equations.

FIG. 2 is a plot showing the Kerr intensity variation I measured by a single CCD pixel of the camera system 122 with respect to the magnetic field H applied by the electromagnet 131 to a magnet material 117' in FIG. 1, and FIG. 3 is a hysteresis loop of a 0.3+0.3 $\mu m^2$ area obtained from the data shown in FIG. 2 by the data analysis system 140 using the above equation 1 and 2.

Figure 4:
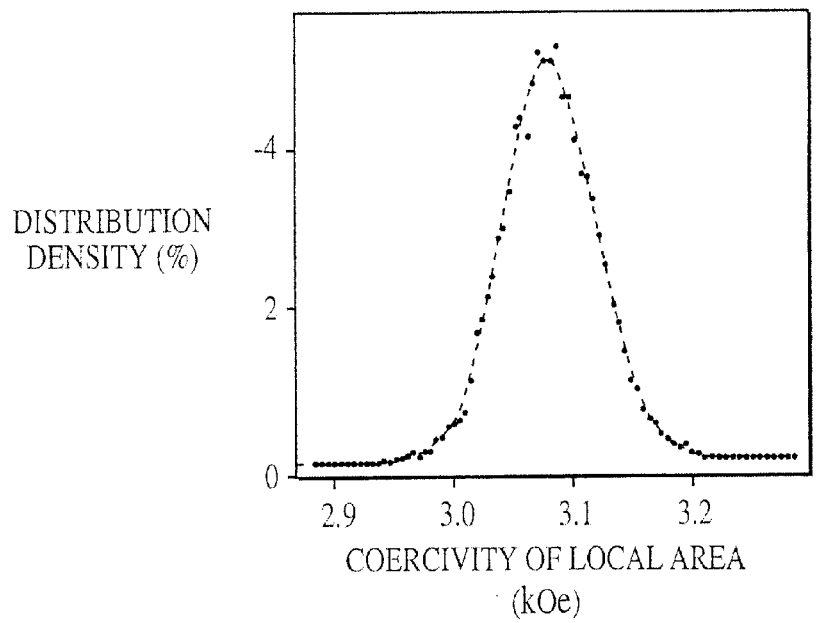
FIG. 4 is a plot for a distribution of a local coercivity of submicrometer-scale areas, measured according to the present invention.

On the other hand, FIG. 4 is a plot for a distribution of the local coercivity of submicrometer-scale areas on a (2-Å Co/11-Å Pd)$_{20}$ sample, measured according to the present invention, where the coercivity was measured from the hysteresis loop obtained as mentioned above. It is clearly seen from FIG. 4 that the coercivity distribution is revealed to be accordant to the Gaussian function. Such distribution data is very useful for developing the Priesach theory of a classical hysteresis loop analysis method, as well as, provides important information on a structural nonuniformity of a magnetic material associated with magnetization reversal dynamics.

Figure 5:
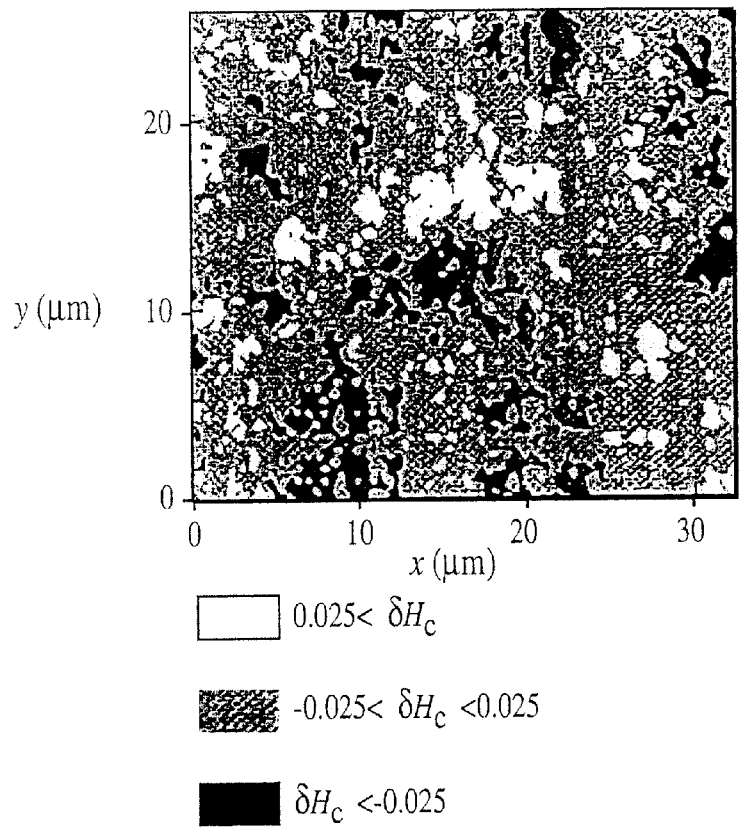
FIG. 5 is a 2-dimensional spatial distribution map of the coercivity, where a color corresponds to a magnitude of the coercivity.

FIG. 5 is a 2-dimentional spatial distribution map of the coercivity, where the color corresponds to the magnitudes of the coercivity. From the distribution map, one can vividly recognize whether the coercivity distribution is spatially uniform or not.

Figure 6:
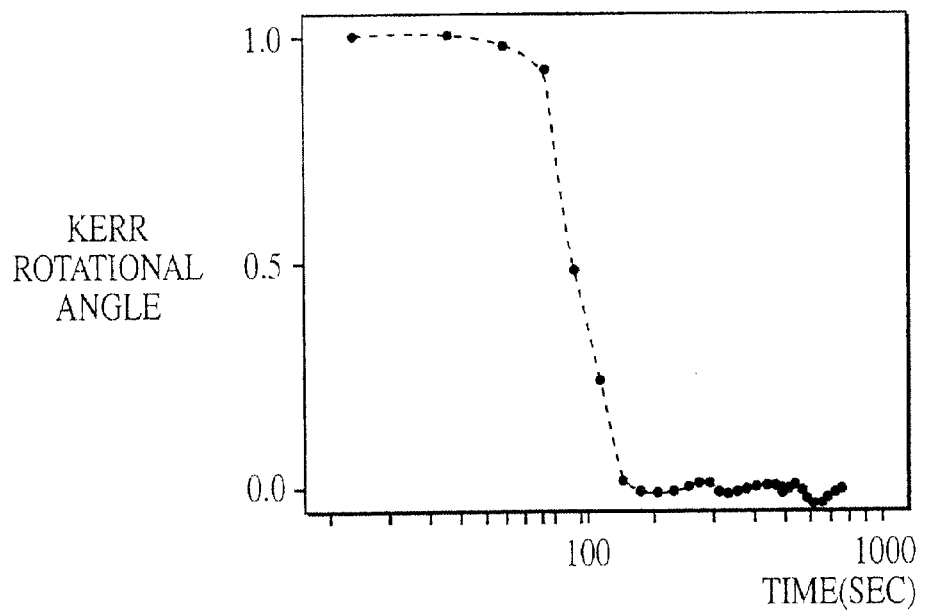
FIG. 6 is a plot of the Kerr intensity variation with respect to an elapsed time t after applying an external magnetic field.
Figure 7:
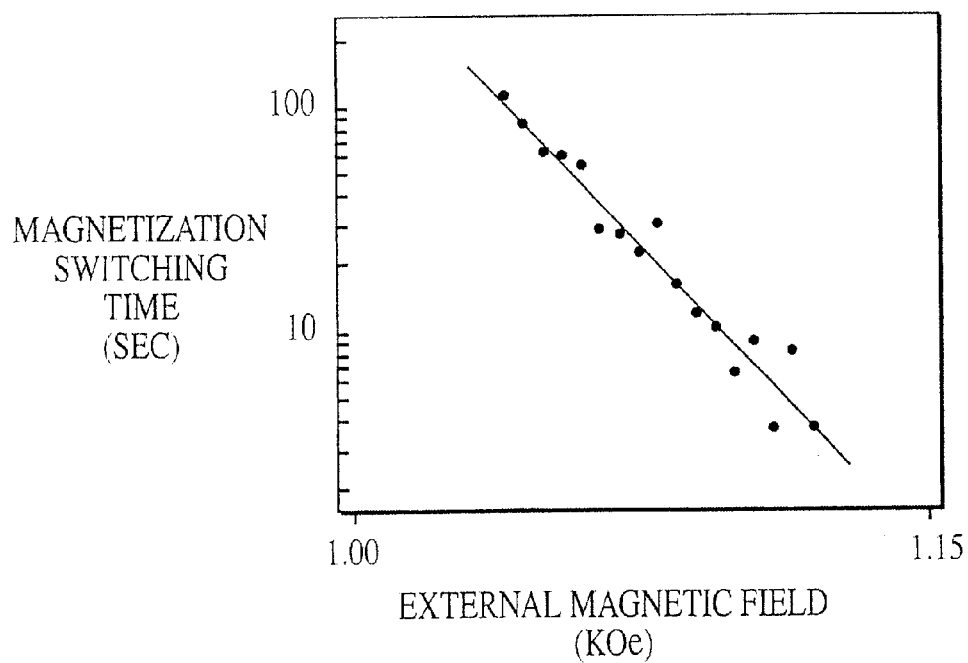
FIG. 7 is a plot of a switching time variation τ with respect to the applied magnetic field H.

FIG. 6 is a plot of the Kerr intensity variation with respect to the elapsed time t after applying an external magnetic field H from the electromagnet 132 into the magnetic material 117', and FIG. 7 is a plot of the switching time variation $\tau$ with respect to the applied magnetic field H. An activation magnetic moment $m_A$ can be determined by analyzing a dependence of the magnetization switching time as shown in FIG. 7 on the magnetic field applied H to the magnetic material 117' on the basis of the equation 3.

Figure 8:
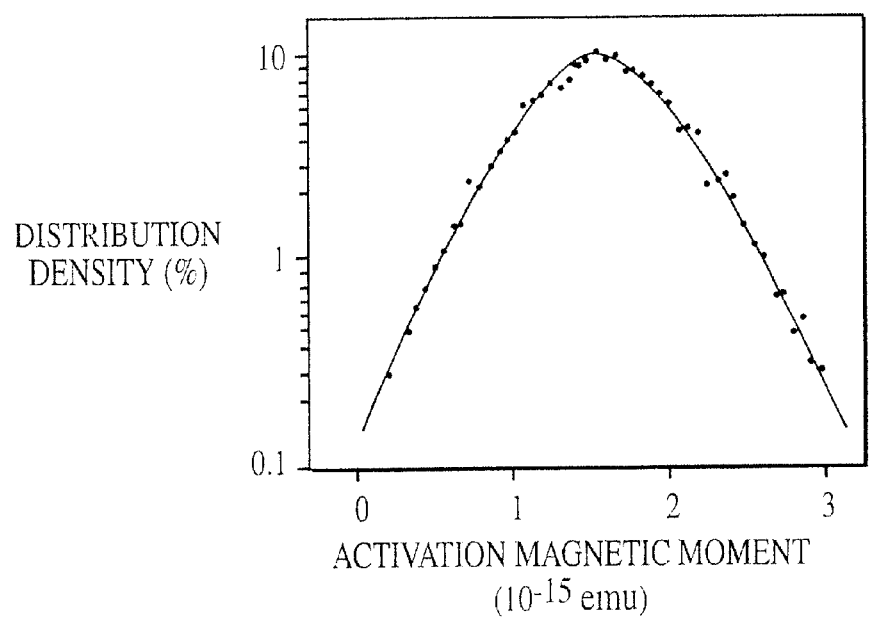
FIG. 8 is a plot showing a distribution of activation magnetic moments, measured according to the present invention.

FIG. 8 is a plot showing a distribution of activation magnetic moments, measured in a (2.5-Å Co/11-Å Pd)$_5$ sample according to the present invention. Interestingly, the activation magnetic moment distribution is well fitted by the equation 4. This activation magnetic moment distribution also provides information regarding a structural nonuniformity of a magnetic material associated with magnetization switching.

$$\sigma = \sigma_0 \exp\left(-\left(\frac{m_A - \overline{m}_A}{\Delta m_A}\right)^{3/2}\right) \quad \text{[Equation 4]}$$

where $\sigma$ is a distribution function of activation magnetic moments, $\sigma_0$ is a normalization constant, $\overline{m}_A$ is the mean value of the activation magnetic moments and $\Delta m_A$ is a standard deviation of the activation magnetic moments.

Figure 9:
FIG. 9 is a 2-dimensional spatial distribution map of the activation magnetic moment, where the color corresponds to the magnitude of the activation magnetic moment.
Figure 9:
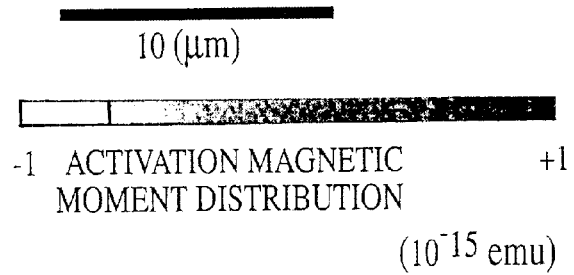

FIG. 9 is a 2-dimentional spatial distribution map of the activation magnetic moment, where the color corresponds to the magnitudes of the activation magnetic moments. The distribution map provides a useful technique for analyzing the spatial uniformity of the magnetic properties.

As apparent from the above description, the present invention provides a magneto-optical microscope magnetometer which is capable of performing both functions of a conventional magneto-optical microscope and conventional magneto-optical magnetometer by using each individual CCD pixel of a camera system in the conventional magneto-optical microscope as a photo-detector of the conventional magneto-optical magnetometer. Therefore, the present magneto-optical microscope magnetometer can measure a hysteresis loop and activation magnetic moment in a submicrometer-scale local area observed by a polarizing optical microscope.

Most importantly, the present magneto-optical microscope magnetometer can simultaneously measure hysteresis loops and activation magnetic moments with respect to all CCD pixels of the camera system and thus, it can generate the 2-dimensional spatial distribution maps of the local magnetic properties, for instance, the local coercivity and the local activation magnetic moment, on the entire magnetic material.

Moreover, the present magneto-optical microscope magnetometer provides a verifying technique on the microscopic magnetic properties of the advanced magnetic/magnetooptic data storage materials and thus, it is very useful to perform the analysis and optimization of the materials. It might enhance the magnetic stability and reliability of industrial products.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A magneto-optical microscope magnetometer, comprising:
   an electromagnet unit that applies a magnetic field to a magnetic material;
   a polarizing optical microscope that magnifies and visualizes a magnetized state of the magnetic material;
   a charge coupled device (CCD) camera system that grabs an image produced by said polarizing optical microscope in real time;
   a data analysis system that converts said image grabbed by said CCD camera system into one of a hysteresis loop and an activation magnetic moment;
   an output system that outputs a result of said grabbed image converted by said data analysis system; and
   a magnetic field control system that controls said electromagnet unit to apply the magnetic field to the magnetic material.

2. The magneto-optical microscope magnetometer of claim 1, wherein said polarizing optical microscope comprises:
   a light source;
   a polarizer that linearly polarizes a light beam from said light source;
   a beam splitter that reflects said light beam linearly polarized by said polarizer;
   an objective lens that focuses said light beam reflected by said beam splitter on said magnetic material and then collimates light reflected from said magnetic material;
   an analyzer that converts said light beam reflected from said magnetic material into said image by linearly polarizing said light beam again; and
   a camera lens that focuses said image from said analyzer to said camera system.

3. The magneto-optical microscope magnetometer of claim 1, wherein said camera system comprises:
   an image intensifier that amplifies said image from said polarizing optical microscope;
   a charge coupled device camera that detects said image amplified by said image intensifier, said camera having an array of CCD pixels; and
   an image grabber that grabs said image detected by said camera with a digital signal.

4. The magneto-optical microscope magnetometer of claim 1, wherein said electromagnet unit comprises:
   an electromagnet that generates said magnetic field; and
   a power supply that supplies a voltage to said electromagnet by said magnetic field control system.

5. The magneto-optical microscope magnetometer of claim 1, wherein said polarizing optical microscope is adapted to magnify and visualize said magnetized state of the magnetic material as said image by including a light source, a polarizer that linearly polarizes a light beam from said light source, a beam splitter that reflects said light beam linearly polarized by said polarizer, and objective lens that focuses said light beam reflected by said beam splitter on the magnetic material and then focuses reflected light from the magnetic material, and an analyzer that converts said light beam reflected from the magnetic material into said image by linearly polarizing said reflected light beam again; and
   wherein said data analysis system is adapted to convert variations in said image grabbed by said CCD camera system into said hysteresis loop by obtaining a Kerr rotation angle of said light beam reflected from the magnetic material on the basis of an intensity of light of said image grabbed by said camera system according to a following equation:

$$I(H) = I^0 + C\sin^2(\theta(H) + \alpha H + \Delta\theta),$$

and then obtaining a correlation between $$\frac{\theta(H)}{\theta_M}$$

and H according to another equation:
   where I is the Kerr intensity measured at a unit CCD pixel of said camera system, $I^0$ is an intensity offset for the given CCD pixel, C is a proportional constant of the Kerr rotation angle, $\alpha$ is a Faraday constant of said objective lens, $\Delta\theta$ is an angle between said polarizer and said analyzer, $\theta_M$ is a maximum Kerr rotation angle when said magnetic material is saturated, and H is a strength of the magnetic field applied to said magnetic material.

6. The magneto-optical microscope magnetometer of claim 1, wherein said data analysis system is adapted to measure said activation magnetic moment from variations in said image grabbed by said CCD camera system by measuring a time of switching in the magnetized state of the magnetic material from a time-dependent variation of a Kerr signal of said light beam reflected from the magnetic material on a basis of an intensity of light of said image grabbed by said camera system, and then analyzing a dependence of a magnetization switching time on said magnetic field applied to said magnetic material in accordance with a following equation:

$$\tau = \tau_0 \exp((E_B - m_A H)/k_B T),$$

where $\tau$ is the magnetization switching time depending on the magnetic field H applied to said magnetic material, $\tau_0$ is a characteristic switching time, $m_A$ is an activation magnetic moment, $k_B$ is a Boltzmann constant and T is a temperature.

* * * * *